US006794107B2

(12) United States Patent
Shimazu et al.

(10) Patent No.: US 6,794,107 B2
(45) Date of Patent: Sep. 21, 2004

(54) THERMAL GENERATION OF A MASK FOR FLEXOGRAPHY

(75) Inventors: Ken-Ichi Shimazu, Briarcliff Manor, NY (US); Kevin B. Ray, Fort Collins, CO (US); John Kalamen, Loveland, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 7 days.

(21) Appl. No.: 10/349,794

(22) Filed: Jan. 23, 2003

(65) Prior Publication Data

US 2004/0081908 A1 Apr. 29, 2004

Related U.S. Application Data

(63) Continuation-in-part of application No. 10/282,994, filed on Oct. 28, 2002, now abandoned.

(51) Int. Cl.[7] .......................... G03F 7/021; G03F 7/30

(52) U.S. Cl. ...................... 430/152; 430/156; 430/160; 430/306

(58) Field of Search ................................ 430/152, 156, 430/157, 160, 306

(56) References Cited

U.S. PATENT DOCUMENTS

| | | | | |
|---|---|---|---|---|
| 2,703,756 A | | 3/1955 | Herrick et al. | |
| 2,714,066 A | | 7/1955 | Jewett et al. | 430/155 |
| 2,923,703 A | | 2/1960 | Bruni et al. | 534/558 |
| 2,976,145 A | | 3/1961 | Baril et al. | 430/152 |
| 2,993,805 A | | 7/1961 | Kay | |
| 3,032,414 A | | 5/1962 | James et al. | 430/169 |
| 3,171,743 A | | 3/1965 | Peticolas | |
| 3,383,213 A | | 5/1968 | Notley et al. | 430/152 |
| 3,547,630 A | | 12/1970 | Notley | |
| 3,615,475 A | | 10/1971 | Skarvinko | 430/152 |
| 3,635,708 A | | 1/1972 | Monahan | 430/290 |
| 3,977,875 A | | 8/1976 | Schumacher | 430/367 |
| 3,979,211 A | | 9/1976 | Chaikin | 430/152 |
| 4,042,391 A | * | 8/1977 | Fukutani et al. | 430/152 |
| 4,139,853 A | | 2/1979 | Ghekiere et al. | 430/290 |
| 4,219,616 A | | 8/1980 | Pope et al. | 430/152 |
| 4,272,603 A | | 6/1981 | Chenevert et al. | 430/155 |
| 4,302,524 A | | 11/1981 | Mandella et al. | 430/155 |
| 4,341,862 A | | 7/1982 | Clarke et al. | 430/327 |
| 4,430,414 A | | 2/1984 | Swanson | 430/176 |
| 4,515,885 A | | 5/1985 | Gatzke et al. | 430/175 |
| 4,863,819 A | | 9/1989 | Drexler et al. | 430/14 |
| 6,238,837 B1 | | 5/2001 | Fan | 430/273.1 |

FOREIGN PATENT DOCUMENTS

| | | |
|---|---|---|
| EP | 0012521 | 6/1980 |
| EP | 0379157 | 7/1990 |
| GB | 1334756 | 10/1973 |
| GB | 1565903 | 4/1980 |
| GB | 1593522 | 7/1981 |
| GB | 1601790 | 11/1981 |
| WO | 01/09679 | 2/2001 |

OTHER PUBLICATIONS

"Light–Sensitive Systems: Chemistry and Application of Nonsilver Halide Photographic Processes" by Jaromir Kosar, pp. 202–214, Wiley, New York 1965.

* cited by examiner

*Primary Examiner*—John S. Chu
(74) *Attorney, Agent, or Firm*—RatnerPrestia

(57) ABSTRACT

Vesicular images are formed by thermal imaging of imageable layers containing thermally imageable vesicular imaging compositions. The vesicular images can be used as masks for imaging printing plate precursors. In one aspect, a printing plate precursor made up of a flexible substrate; a photosensitive layer that contains a negative working photosensitive composition; an optional barrier layer; and the imageable layer is thermally imaged to produce an integral mask. Blanket exposure through the mask with ultraviolet and/or visible radiation followed by development produces a printing plate. The method is especially suited for the production of flexographic printing plates.

34 Claims, No Drawings

THERMAL GENERATION OF A MASK FOR FLEXOGRAPHY

CROSS-REFERENCE TO RELATED APPLICATIONS

This application is a continuation-in-part of U.S. application Ser. No. 10/282,994, filed on Oct. 28, 2002 now abandoned, incorporated herein by reference.

FIELD OF THE INVENTION

The invention relates to vesicular imaging. More particularly, this invention relates to methods for forming vesicular images and to the use of these images as masks for imaging printing plate precursors, especially flexographic printing plate precursors.

BACKGROUND OF THE INVENTION

Flexographic printing plates are used in letterpress printing, particularly on surfaces which are soft and easily deformable, such as packaging materials, e.g., cardboard, paper, and plastic packaging films. Flexographic printing plates can be prepared from imageable elements that comprise a photosensitive layer on a substrate. The element is imaged with ultraviolet and/or visible radiation and then developed with a suitable developer leaving a printing relief, which can be used for flexographic printing. If after exposure to radiation the exposed regions of the photosensitive layer are removed in the developing process, the element is positive working. Conversely, if the developing process removes the unexposed regions and the exposed regions remain, the element is negative working.

Imaging of the imageable element with ultraviolet and/or visible radiation is typically carried out through a mask, which has clear and opaque regions. Imaging takes place in the regions of the photosensitive layer under the clear regions of the mask but does not occur in the regions of the photosensitive layer under the opaque regions of the mask. The mask is usually a photographic negative of the desired image. If corrections are needed in the final image, a new mask must be made. This is a time-consuming process. In addition, the mask may change slightly in dimension due to changes in temperature and humidity. Thus, the same mask, when used at different times or in different environments, may give different results and could cause registration problems.

Direct digital imaging of printing plate precursors, which obviates the need for exposure through a mask, is becoming increasingly important in the printing industry. In these processes, a computer controlled laser scans and images the photosensitive layer of the printing plate precursor. However, it has not been practical to use lasers to image flexographic printing plate precursors. These elements have low photosensitivity and require long exposure times even with high-powered lasers. In addition, most of the imageable materials used in these elements have their greatest sensitivity in the ultraviolet region of the spectrum. Although ultraviolet emitting lasers are known, economical and reliable ultraviolet lasers with high power are not readily available. However, relatively inexpensive infrared lasers that have a useful power output are readily available. These lasers have been used to form a mask over the photosensitive layer.

Flexographic printing plate precursors that comprise an imageable layer that is ablatable by infrared radiation over the photosensitive layer have been used to retain the advantages of direct digital imaging. The imageable layer is imaged with an infrared laser to form a mask and the resulting element exposed with ultraviolet and/or visible radiation through the mask. However, because ablation produces debris, the platesetter used to image ablative masks requires additional filtration systems to prevent the debris from contaminating the optics of the platesetter. In addition, some of the ablatable layers require large amounts of expensive infrared absorbers.

Thus, a need exists for imageable elements useful as flexographic printing plate precursors that have the advantages of direct digital imaging but do not have the disadvantages of laser ablation.

SUMMARY OF THE INVENTION

In one aspect, the invention is a method for forming vesicular images. The method comprises the steps of:

(A) providing an imageable element comprising an imageable layer on a substrate, in which the imageable layer comprises a thermally imageable vesicular imaging composition; and (B) thermally imaging the imageable layer and forming an imaged imageable layer, the imaged imageable layer comprising a vesicular image;

in which the thermally imageable vesicular imaging composition comprises a sensitizer and polymeric material.

In one aspect, the method additionally comprises a thermal development step. In another aspect, the imageable element is overall (flood) exposed with ultraviolet radiation after step (A) and before step (B).

In another aspect, the invention is a method for forming a relief image, the method comprising the steps of:

(A) providing an imageable element, the imageable element comprising, in order:

(i) a substrate;

(ii) a photosensitive layer, the photosensitive layer comprising a photoimageable composition, and (iii) a masking layer, the masking layer comprising a thermally imageable vesicular imaging composition, the thermally imageable vesicular imaging composition comprising a sensitizer and a polymeric material;

(B) thermally imaging the masking layer and forming a vesicular image in the masking layer;

(C) overall exposing the imageable element to actinic radiation through the masking layer and forming an imaged imageable element comprising imaged and complementary unimaged regions in the photosensitive layer; and (D) developing the imaged imageable element in a developer and forming the relief image by removing either the unimaged regions or the imaged regions.

In another aspect, the substrate is a flexible substrate and the photosensitive layer comprises a negative working photosensitive composition. The resulting relief image is useful as a flexographic printing plate.

DETAILED DESCRIPTION OF THE INVENTION

Unless the context indicates otherwise, in the specification and claims, the terms binder, polymeric material, sensitizer, photothermal conversion material, monomer, photoinitiator, coating solvent, and similar terms also include mixtures of such materials. Unless otherwise specified, all percentages are percentages by weight.

Imageable Elements

In one aspect, the imageable element comprises an imageable layer over a substrate. In another aspect, the imageable element comprises, in order, a substrate, a photosensitive layer, optionally an overcoat or barrier layer, and an imageable layer. The imageable layer comprises a thermally imageable vesicular imaging composition. The thermally imageable vesicular imaging composition comprises a sensitizer and a polymeric material. When present, the photosensitive layer comprises a photosensitive composition, typically a negative working photosensitive composition.

Substrate

The substrate comprises a support, which may be any material conventionally used to prepare imageable elements. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

For imageable elements useful as flexographic printing plate precursors, the substrate comprises a flexible support, which may be any flexible material conventionally used to prepare imageable elements useful as printing plates. The support is preferably strong and stable. It should resist dimensional change under conditions of use so that color records will register in a full-color image. Because imaging with a heated body, such as a thermal head, requires good contact with the imageable layer for imaging, the support material must be flexible for good contact during imaging. When the imageable element requires a back exposure, the substrate must be transparent to the radiation used for the back exposure. When the imaged imageable element is to be used as a mask, the substrate should be transparent to the radiation that will used for imaging through the mask.

Suitable support materials include polymeric films such as polyester, polystyrene, polyethylene, polypropylene, polycarbonate, polyamide and fluoropolymers. A preferred support is a polyester film; particularly preferred is polyethylene terephthalate. The support is typically about 0.0051 to 0.025 cm thick, preferably about 0.0076 to 0.020 cm thick.

The substrate may also comprise a subbing layer over the surface of the support adjacent to the photosensitive layer and an antihalation layer on either or both surfaces of the support.

Photosensitive Layer

The photosensitive layer comprises a layer of a photosensitive composition over the substrate. Any photosensitive composition used in the photosensitive layer of imageable elements may be used in the photosensitive layer. This includes both negative working and positive working photosensitive compositions. Positive working compositions based on diazonaphthoquinones and phenolic resins are described, for example, in *Photoreactive Polymers: The Science and Technology of Resists*, A. Reiser, Wiley, New York, 1989, pp. 178–225; in Shimazu, U.S. Pat. No. 6,294,311; in Savariar-Hauck, U.S. Pat. No. 6,358,669; and in Parsons, U.S. Pat. No. 6,280,899. Negative working compositions based on crosslinking are described in Reiser, pp. 22–64. Negative working compositions based on photopolymerization (i.e., photopolymerizable compositions) are described in Reiser, pp. 102–177; in "Photopolymers: Radiation Curable Imaging Systems," by B. M. Monroe, in *Radiation Curing: Science and Technology*, S. P. Pappas, Ed., Plenum, New York, 1992, pp. 399–440; and "Polymer Imaging" by A. B. Cohen and P. Walker, in *Imaging Processes and Material*, J. M. Sturge, et al., Eds, Van Nostrand Reinhold, New York, 1989, pp. 226–262. The disclosure of each of these references is incorporated herein by reference.

For flexographic printing plates, any photosensitive composition used in the photosensitive layer of flexographic printing plate precursors may be used in the photosensitive layer. Negative-working, ultraviolet and/or visible sensitive, photopolymerizable photosensitive compositions useful in the photosensitive layer of flexographic printing plate precursors, are well known. These compositions comprise an elastomeric binder, at feast one free-radical polymerizable monomer, and a photoinitiator that is sensitive to ultraviolet and/or visible radiation. Examples of suitable compositions have been disclosed, for example, in Chen, U.S. Pat. No. 4,323,637; Gruetzmacher, U.S. Pat. No. 4,427,749; and Feinberg, U.S. Pat. No. 4,894,315.

The elastomeric binder can be a single polymer or mixture of polymers that are soluble, swellable or dispersible in aqueous, semi-aqueous or organic solvent developers. Binders that are soluble or dispersible in aqueous or semi-aqueous developers have been disclosed in Alles, U.S. Pat. No. 3,458,311; Pohl, U.S. Pat. No. 4,442,302; Pine, U.S. Pat. No. 4,361,640; Inoue, U.S. Pat. No. 3,794,494; Proskow, U.S. Pat. No. 4,177,074; Proskow, U.S. Pat. No. 4,431,723; and Worns, U.S. Pat. No. 4,517,279. Elastomeric binders that are soluble, swellable or dispersible in organic solvent developers include natural or synthetic polymers of conjugated diolefin hydrocarbons, including polyisoprene, poly(1,2-butadiene), poly(1,4-butadiene), butadiene/acrylonitrile, polystyrene-polybutadiene-polystyrene thermoplastic-elastomeric block copolymers, polystyrene-polyisoprene-polystyrene thermoplastic-elastomeric block copolymers, and other copolymers. The block copolymers discussed in Chen, U.S. Pat. No. 4,323,636; Heinz, U.S. Pat. No. 4,430,417; and Toda, U.S. Pat. No. 4,045,231, can be used. Core shell microgels and blends of microgels and preformed macromolecular polymers, such as those disclosed in Fryd, U.S. Pat. No. 4,956,252, may also be used. The photosensitive composition typically comprises about 40 wt % to about 90 wt %, preferably about 55 wt % to about 85 wt %, of the binder or binders.

The photosensitive composition comprises a free-radical polymerizable monomer or mixture of free-radical polymerizable monomers. The monomer or monomers must be compatible with the binder and the other ingredients to the extent that a clear, non-cloudy photosensitive layer is produced. Monomers are well known in the art and include, for example, addition-polymerization ethylenically unsaturated compounds having relatively low molecular weights (generally less than about 30,000). Preferably, the monomers have a relatively low molecular weight, less than about 5000.

Numerous unsaturated monomers, oligomers, and prepolymers polymerizable by free-radical initiated addition polymerization and useful in photosensitive compositions are known, in the art. Typical multifunctional monomers are unsaturated esters of alcohols, preferably acrylate and methacrylate esters of polyols, such as, trimethylol propane tri- and tetraacrylate and methacrylate; the tri- and tetraacrylate and methacrylate esters of ethoxylated trimethylolpropane; diethylene glycol diacrylate and dimethacrylate; triethylene glycol diacrylate and dimethacrylate; 1,4-butanediol diacrylate and dimethacrylate; 2,2,4-trimethyl-1,3-pentanediol diacrylate and dimethacrylate; 1,8-octanediol diacrylate and dimethacrylate; 1,10-decanediol diacrylate and dimethacrylate; polyethylene glycol diacrylate and dimethacrylate;

glycerol triacrylate and trimethacrylate; ethylene glycol dimethacrylate; pentaerythritol tri- and tetraacrylate and methacrylate; dipentaerythriol penta- and hexaacrylate and methacrylate; tripropylene glycol diacrylate and dimethacrylate; the di-(2-acryloxyethyl)ether and the di-(2-methacryloxyethyl)ether of bisphenol A; ethoxylated bisphenol A diacrylate and dimethacrylate; 1,6-hexanediol diacrylate and dimethacrylate; and neo-pentyl glycol diacrylate and dimethacrylate. Monofunctional monomers, which are sometimes used in combination with multifunctional monomers include, for example, t-butyl acrylate and methacrylate, N,N-diethylaminoethyl acrylate, 2-hydroxyethyl methacrylate, 2-hydroxypropyl methacrylate, 2-ethoxyethyl acrylate and methacrylate, 2-(2-ethoxyethoxy)ethyl acrylate and methacrylate, 2-ethylhexyl acrylate and methacrylate, octyl acrylate and methacrylate, lauryl acrylate and methacrylate, 2-phenoxyethyl acrylate and methacrylate, benzyl acrylate and methacrylate, isobomyl acrylate and methacrylate, phenyl acrylate and methacrylate, 2-phenylethyl acrylate and methacrylate, and tetrahydrofurfuryl acrylate and methacrylate. Further examples of monomers useful in the photosensitive layer of flexographic printing plate precursors can be found in Chen, U.S. Pat. No. 4,323,636; Fryd, U.S. Pat. No. 4,753,865; Fryd, U.S. Pat. No. 4,726,877; and Feinberg, U.S. Pat. No. 4,894,315. The photosensitive composition typically comprises about 5 wt % to 60 wt %, preferably 15 wt % to 50 wt %, of the monomer or monomers.

The photoinitiator can be any single compound or combination of compounds that generate free radicals that initiate the polymerization of the monomer or monomers without excessive termination. The photoinitiator is sensitive to visible or ultraviolet radiation, preferably ultraviolet radiation, and should be insensitive to infrared radiation and should be thermally inactive at and below 250° C. Photoinitiators are disclosed in "Photoinitiators for Free-Radical-Initiated Photoimaging Systems," by B. M. Monroe and G. C. Weed, *Chem. Rev.,* 93, 435–448 (1993) and in "Free Radical Polymerization" by K. K. Dietliker, in *Chemistry and Technology of UV and EB Formulation for Coatings, Inks, and Paints*, P. K. T. Oldring, ed, SITA Technology Ltd., London, 1991, Vol. 3, pp. 59–525. Suitable photoinitiators have been disclosed in Gruetzmacher, U.S. Pat. No. 4,460,675, and Feinberg, U.S. Pat. No. 4,894,315. Examples of photoinitiators include substituted and unsubstituted polynuclear quinones, benzophenone; benzophenone and 4,4'-bis(dimethylamino)benzophenone; benzophenone and 4,4'-bis(diethylamino)benzophenone; 2-hydroxy-2-methyl-1-phenylpropan-1-one; 2,4,6-trimethylbenzolyl-diphenylphosphine oxide; 2,2-dimethoxy-2-phenyl-acetophenone (benzildimethyl ketal); 2-methyl-1-[4-(methylthio)phenyl]-2-morpholinopropanone-1; 1-hydroxycyclohexylphenyl ketone; bis(2,6-dimethoxybenzolyl)-2,4,4-trimethyl-pentylphosphine oxide; and combinations thereof. The photosensitive composition typically comprises about 0.001 wt % to 10.0 wt % photoinitiator or photoinitiators.

The photosensitive composition may comprise other additives depending on the final properties desired. Such additives include plasticizers, rheology modifiers, thermal polymerization inhibitors, tackifiers, colorants, surfactants, antioxidants, antiozonants, or fillers. Plasticizers are used to adjust the film-forming properties of the elastomer. Plasticizers are well known in the art and include, for example, aliphatic hydrocarbon oils, e.g., naphthenic and paraffinic oils; and liquid polydienes, e.g., liquid polybutadiene and liquid polyisoprene. When present, the photosensitive composition typically comprises about 1 wt % to about 15 wt % of the plasticizer or plasticizers.

Resistance of the elements and the flexographic printing plates prepared therefrom to oxygen and ozone attack can be improved by incorporating in the photosensitive composition a suitable amount of compatible antioxidants and/or antiozonants. Antioxidants include, for example, alkylated phenols, e.g., 2,6-di-t-butyl-4-methyl phenol; alkylated bisphenols, e.g., 2,2-methylene-bis-(4-methyl-6-t-butyl phenyl); 1,3,5-trimethyl-2,4,6-tris-(3,5-di-t-butyl-4-hydroxybenzyl) benzene; 2-(4-hydroxy-3,5-t-butyl anilino)-4,6-bis-(n-octylthio)1,3,5-triazone; polymerized trimethyl dihydroquinone; zinc dibutyl dithiocarbamate and zinc dilaurylthiodipropionate. Antiozonants include, for example, microcrystalline wax and paraffin wax; dibutyl thiourea; 1,1,3,3-tetramethyl-2-thiourea; norbornenes such as di-5-norbornene-2-methyl adipate; and unsaturated vegetable oils. The composition may also comprise one or more dyes for identification or aesthetic purposes, provided they are compatible with the other ingredients, do not strongly absorb the radiation used for photopolymerization, and do not otherwise interfere with photopolymerization. When present, the composition typically comprises about 1 wt % to about 5 wt % of these ingredients.

The mixture of monomer, binder, photoinitiator, and other ingredients, if any, should produce a clear, non-cloudy photosensitive layer, without causing appreciable scattering of the radiation used for overall exposure. The thickness of the photosensitive layer can vary over a wide range depending upon the type of printing plate desired. For so-called "thin plates" the photosensitive layer is about 0.05 to 0.17 cm thick. Thicker plates will have a photosensitive layer about 0.25 to 0.64 cm thick, or greater.

Barrier Layer

When the photosensitive layer comprises a photopolymerizable composition such as is used in a flexographic printing plate precursor, an essentially oxygen-impermeable overcoat or barrier layer, which is soluble in the developer and transparent to the radiation used for the overall exposure, may be present. When present, the barrier layer is typically between the photosensitive layer and the imageable layer. The barrier layer inhibits the migration of oxygen into the photosensitive layer and can inhibit the migration of materials from the photosensitive layer into the imageable layer.

Preferred materials for the barrier layer are water-soluble polymers such as polyvinyl alcohol, polyvinyl alcohol/polyvinyl acetate copolymers, polyvinyl pyrrolidone, vinyl pyrrolidone/vinyl acetate copolymers, polyvinyl methyl ether, ring-opened copolymers of maleic anhydride and co-monomers such as methyl vinyl ether, polyacrylic acid, geatin, cellulose ethers, and mixtures thereof. Most preferred is polyvinyl alcohol. Because polyvinyl alcohol is also a preferred material for the imageable layer, the imageable layer may also act as a barrier layer, making a separate barrier layer unnecessary.

The barrier layer may also contain other ingredients, such as surfactants. To improve the adhesion of the barrier layer to the photosensitive layer, an adhesion promoter can be added to the barrier layer formulation. One example for such an adhesion promoter is poly(vinyl imidazole) as disclosed in WO 99/06890. The coating weight of the barrier layer typically is about 0.1 to 6 g/m$^2$, and more typically about 0.5 to 4 g/m$^2$.

Thermally Imageable Layer and Masking Layer

The thermally imageable layer comprises a thermally imageable vesicular imaging composition. Vesicular images typically comprise patterns of small bubbles or vesicles of gas entrapped in a polymeric material. Because these bubbles have a refractive index that is very different from that of the polymeric material, they refract light, forming the image. When the thermally imageable layer is used to form a mask, it is also called the masking layer.

A thermally imageable vesicular imaging composition comprises (1) a thermoplastic polymeric material and (2) a compound that releases a gas when heated, which is called a sensitizer. Layers comprising these compositions are thermally imaged to produce an image comprising imaged and unimaged regions. In some but not all cases, it is advantageous to heat the element after imaging to expand the bubbles in the exposed regions. Controlled heating, or thermal development, softens the polymeric material and allows the gas to expand, creating or enlarging the bubbles in the polymeric material.

Alternatively, the imageable layer may be overall exposed with ultraviolet radiation to decompose the sensitizer prior to thermal imaging. Thermal imaging softens the polymeric material and allows the gas to expand in the imaged regions. Because heating softens the polymeric material and allows the gas to expand, post-imaging thermal development should not be carried out when the imageable layer has been preexposed with ultraviolet radiation.

Thermal imaging may be carried out with infrared radiation or with a heated body. When the imageable layer is to be imaged with infrared radiation, the element comprises a photothermal conversion material, either in the imageable layer and/or in a separate absorber layer. When imaging is to be carried out with a heated body, it is unnecessary for the element to comprise a photothermal conversion material. However, elements that comprise a photothermal conversion material may be imaged with a heated body.

Suitable sensitizers are compounds that do not react with the polymeric material, are soluble in the coating solvent used to coat the imageable layer, and are stable at ambient temperature but decompose to liberate a gas when heated. When the element will be thermally developed after imaging, the sensitizer should be stable to thermal development conditions, typically between about 100° C. and about 140° C. for about 10 seconds to about 30 seconds, but should decompose to liberate a gas when briefly heated to about 150° C. to about 400° C. during thermal imaging.

Suitable sensitizers include a variety of diazo-compounds that liberate nitrogen when heated, such as diazonium salts, quinonediazides, azides, and carbazides. The sensitizers are characterized by the ability to liberate gas when heated. Sensitizers that liberate nitrogen are particularly effective. Preferred sensitizers include diazonium compounds.

Diazonium compounds, such as polymers, oligomers and salts, are well known in the art. These compounds typically comprise an aromatic nucleus with an external diazonium group and an anion (see, for example, *Light-Sensitive Systems*, J. Kosar, pp. 202–214, Wiley, 1965, New York). They may be generally represented by the formula: $ArN_2^+ X^-$, in which Ar is an aromatic group, and X is an anion. These compounds are disclosed, for example, in Notley, U.S. Pat. No. 3,485,631; James, U.S. Pat. No. 3,032,414; Buni, U.S. Pat. No. 2,923,703; and Baril, U.S. Pat. No. 2,976,145. Condensation products of diazonium salts with aldehydes, such as formaldehyde, are described in Jewett, U.S. Pat. No. 2,714,066. Typical diazonium compounds include, for example: p-diazo diphenylamine sulfate; p-diazo-N,N-dimethylaniline zinc chloride; p-diazo-N,N-diethylaniline zinc chloride; p-diazo N-ethyl N-hydroxyethylaniline zinc chloride, p-diazo N-ethyl N-methyl aniline zinc chloride; 3-methyl-4-diethyl amino benzene diazonium chloride; 1-diazo-2-oxy naphthalene-4-sulfonate; 4-diazo-2-methoxy-1-cyclohexylamino benzene p-chlorobenzene-sulfonate; 4-N,N-dimethylaniline chloride; p-diazo-N,N-diethylaniline fluoroborate; p-diazodiphenylamine sulfate; (2,5-diethoxy-4-(4'-tolylthio))-benzene diazonium fluoroborate; 2,5-diethyoxy-4N-morpholino-benzene diazonium fluoroborate; 2,5-diethyoxy-4-piperidyl-benzene diazonium chloride; 4-morpholino benzene diazonium chloride; 2,4-benzylamino-2,5-diethoxy benzene diazonium chloride; 4-piperidyl-2,5-diethoxy benzene diazonium chloride; 1-dimethyl amino naphthalene-4-diazonium chloride; and 4-phenyl amino diazo benzene diazonium chloride.

Typical diazonium resins are the diazonium salt formed from the condensation product of 4-diazo diphenylamine and 4,4'-bismethoxymethyl diphenyl ether, with a phosphate counter ion, and the diazonium salt formed from the condensation product of 3-methoxy-4-diazo diphenylamine and 4,4'-bismethoxymethyl diphenyl ether, with a mesitylene sulfonate counter ion. Diazo oxides are also useful and are included in the term diazonium materials.

Preferred polymeric materials are water-soluble polymers, such as polyvinyl alcohol, polyvinyl alcohol/polyvinyl acetate copolymers, polyvinyl pyrrolidone, vinyl pyrrolidone/vinyl acetate copolymers, polyvinyl methyl ether, ring-opened copolymers of maleic anhydride and co-monomers such as methyl vinyl ether, polyacrylic acid, geatin, cellulose ethers, and mixtures thereof. Most preferred is polyvinyl alcohol. The imageable layer preferably comprises a developer soluble polymeric material so a separate step to remove the imageable layer is not necessary.

Vesicular imaging systems comprising a diazonium compound, a nitrate salt, and a polymeric material comprising gelatin or polyvinyl alcohol are disclosed in Gatzke, U.S. Pat. No. 4,515,885. Preferred salts are the hydrated metal salts such as nickel nitrate hexahydrate, magnesium nitrate hexahydrate, aluminum nitrate nonahydrate, ferric nitrate nonahydrate, cupric nitrate trihydrate, zinc nitrate hexahydrate, cadmium nitrate tetrahydrate, bismuth nitrate pentahydrate, thorium nitrate tetrahydrate, cobalt nitrate hexahydrate, gadolinium or lanthanum nitrate nonahydrate, and mixtures of these hydrated nitrates. Organic nitrates guanadinium nitrate, pyridinium nitrate, and ammonium nitrate may also be used.

The polymeric material typically comprises about 70 wt % to about 99.92 wt %, typically 75 wt % to 95 wt %, preferably 75 wt % to 90 wt %, more preferably 80 wt % to 90 wt %, of the imageable layer. The sensitizer typically comprises about 0.08 wt % to about 30 wt %, typically about 0.08 wt % to about 10 wt %, preferably 0.1 wt % to 5 wt %, more preferably 0.25 wt % to 3 wt % of the imageable layer.

When the imageable layer is to be imaged by infrared radiation, the element absorbs infrared radiation, preferably radiation in the range of about 800 nm to 1200 nm, the range of radiation commonly used for imaging thermally imageable elements. An absorber, sometimes called "a photothermal conversion material", is present in the element, either in the underlayer or in a separate absorber layer. Photothermal conversion materials absorb radiation and convert it to heat.

When the imageable layer is negative working, the photothermal conversion material preferably should not substantially absorb or scatter the radiation used for overall exposure of the imageable element, i.e., ultraviolet and/or visible radiation. Consequently, dyes that absorb in the infrared but not in the ultraviolet and the visible are preferred. To prevent sludging of the developer by insoluble material, dyes that are soluble in the aqueous alkaline developer are preferred for use in both negative working and positive working elements.

The photothermal conversion material may be, for example, an indoaniline dye, an oxonol dye, a porphyrin derivative, an anthraquinone dye, a merostyryl dye, a pyrylium compound, or a squarylium derivative with the appropriate absorption spectrum and solubility. Dyes, especially dyes with a high extinction coefficient in the range of 750 nm to 1200 nm, are preferred. Absorbing dyes are disclosed in numerous publications, for example, Nagasaka, EP 0,823, 327; DeBoer, U.S. Pat. No. 4,973,572; Jandrue, U.S. Pat. No. 5,244,771; and Chapman, U.S. Pat. No. 5,401,618. Examples of useful cyanine dyes include: 2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1, 3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)-ethylidene]-1-cyclopenten-1-yl]-ethenyl]-1,3,3-trimethyl-3H-indolium tosylate; 2-[2-[2-chloro-3-[2-ethyl-(3H -benzthiazole-2-ylidene)-ethylidene]-1-cyclohexen-1-yl]-ethenyl]-3-ethyl-benzthiazolium tosylate; and 2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium tosylate. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectralR 830A and SpectralR 840A (Spectra Colors), and IR Dye A, IR Dye B, and IR Dye C, whose structures are shown below.

% to about 25 wt %, preferably 2 wt % to 20 wt %, more preferably 2 wt % to 15 wt %, of the thermally imageable vesicular imaging composition.

It has been found that by controlling the thickness of the imageable layer and/or the extent of vesicle formation during imaging, it is possible to produce a positive or a negative mask. If an imageable layer that contains a photothermal conversion material and has a low coating weight, i.e., typically about 1 g/m$^2$ to about 6 g/m$^2$, is imaged, the vesicles are sufficiently transparent to the radiation used for imaging the photosensitive layer and the unexposed regions of the imageable layer, which contain the photothermal conversion material, are sufficiently opaque to this radiation that the imaged imageable layer will act as a positive mask (i.e., the radiation used for imaging the photosensitive layer is more readily transmitted by the exposed regions of the imageable layer). An imageable layer that acts in a positive sense can also be produced if a low level of vesicles is formed during imaging, either with infrared radiation or with a hot body.

However, if the imageable layer has a high coating weight, i.e., typically about 7 g/m$^2$ to about 15 g/m$^2$, and/or a large number of vesicles are produced during imaging, the imageable layer will act as a negative mask (i.e., the radiation used for imaging the photosensitive layer is more readily transmitted by the unexposed regions of the imageable layer). Regardless of coating weight, a negative mask will also be produced if the particular thermally imageable vesicular imaging composition used in the imageable layer has an excellent propensity to generate vesicles on thermal imaging.

IR Dye A

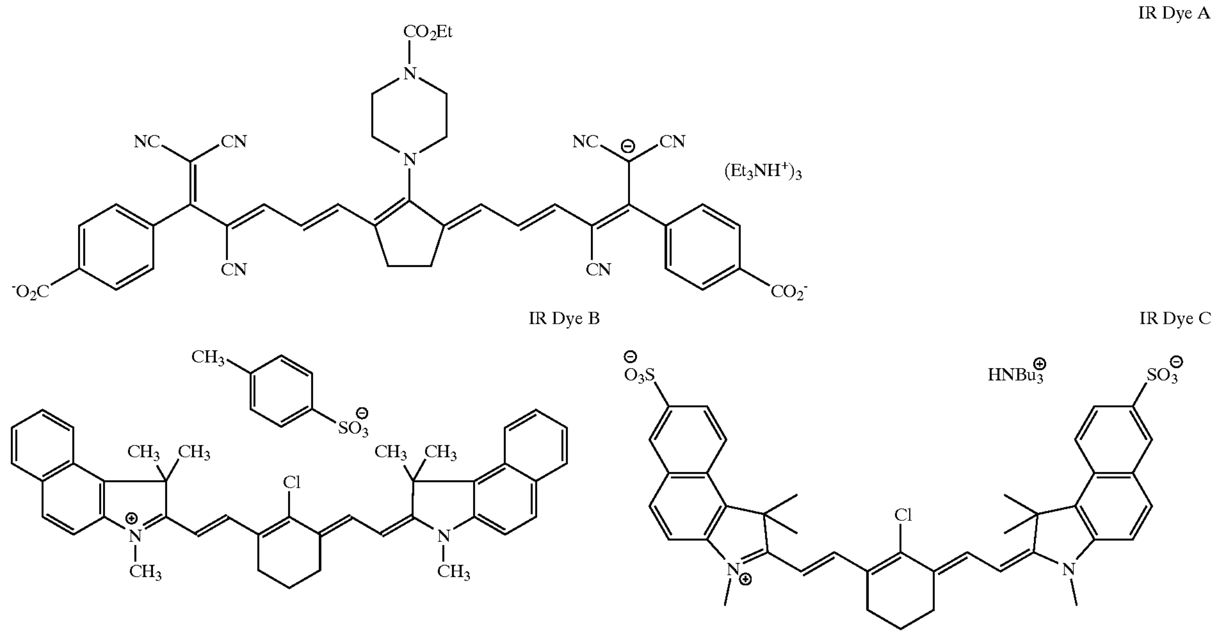

The amount of photothermal conversion material in the thermally imageable vesicular imaging composition is generally sufficient to provide an optical density of at least 0.05, and preferably, an optical density of from about 0.5 to about 2 at the imaging wavelength. As is well known to those skilled in the art, the amount of photothermal conversion material required to produce a particular optical density can be determined from the thickness of the underlayer and the extinction coefficient of the photothermal conversion material at the wavelength used for imaging using Beers law. When present, the photothermal conversion material comprises at least about 1 wt %, and preferably from about 1 wt

Coversheet

The imageable element may also comprise a temporary coversheet over the imageable layer. The coversheet protects the imageable layer during storage and handling. Examples of suitable materials for the coversheet include thin films of polystyrene, polyethylene, polypropylene, polycarbonate, fluoropolymers, polyamide or polyester, which can be subbed with release layers.

Preparation of the Imageable Elements

The imageable elements may be prepared by applying a layer of photosensitive composition over a surface of the substrate using conventional extrusion, coating, or lamination methods. Typically the ingredients are dispersed or dissolved in a suitable coating solvent, and the resulting mixture coated by conventional methods, such as spin coating, bar coating, gravure coating, roller coating, dip coating, air knife coating, hopper coating, blade coating, and spray coating. The term "coating solvent" includes mixtures of solvents.

A variety of conventional organic solvents, for example, alcohols such as methyl alcohol, ethyl alcohol, n- and i-propyl alcohols, n- and i-butyl alcohols and diacetone alcohol; ketones such as acetone, methyl ethyl ketone, methyl propyl ketone, diethyl ketone, and cyclohexanone; polyhydric alcohols and derivatives thereof such as ethylene glycol, ethylene glycol monomethyl ether or its acetate, ethylene glycol monoethyl ether or its acetate; ethylene glycol diethylether, ethylene glycol monobutyl ether or its acetate, propylene glycol monomethyl ether or its acetate, propylene glycol monoethyl ether or its acetate, propylene glycol monobutyl ether, 3-methyl-3-methoxybutanol; and special solvents such as N,N-dimethylformamide, methyl lactate, and ethyl lactate, can be used as the coating solvent for the photosensitive layer. However, for convenience during the drying process, solvents having a boiling point of between about 40° C. and about 160° C., preferably between about 60° C. and about 130° C., are typically used. The solids content of the coating solution is typically about 2 to about 25 wt %, based on the weight of the solvent. Selection of the coating solvent will also depend on the nature of the ingredients present in the photosensitive composition.

Drying is typically carried out using heated air. The air temperature is preferably between about 30° C. and about 200° C., more preferably between about 40° C. and about 120° C. The air temperature may be held constant during the drying process, or may be gradually stepped up. Although the thickness of the photosensitive layer will depend on the type of printing plate desired, for elements useful as flexographic printing plate precursors the thickness is typically between 0.25 to 0.64 cm thick.

Alternatively, the ingredients may be fed into an extruder and the photosensitive layer extruded onto the substrate. The extruder performs the function of melting, mixing, deaerating and filtering the photosensitive composition.

The barrier layer, if present, may be applied over the photosensitive layer using conventional coating or lamination techniques, such as are described above. To prevent mixing of the layers during coating, the barrier layer is preferably coated from a solvent in which the photosensitive layer is essentially insoluble. Typical coating solvents for the barrier layer are water and aqueous solvents that contain small amounts of organic solvents such as methanol, ethanol, or i-propyl alcohol.

The imageable layer may be applied over the barrier layer if present, or the photosensitive layer if the barrier layer is not present, using conventional coating or lamination techniques, such as are described above. Although other solvents may be used, water is frequently a good coating solvent for the imageable layer. The imageable layer is typically dried by heating at about 20° C. to about 150° C. for about 0.5 min to about 5 min.

The coversheet, if present, is typically laminated over the imageable layer.

Imaging and Processing

The coversheet, if present, is removed before imaging, typically by being peeled off.

The imageable layer may be overall exposed with ultraviolet radiation to decompose the sensitizer prior to thermal imaging. This pre-exposure step may be conveniently carried out in a standard lighfframe. However, it is not necessary that the lighfframe be evacuated during the pre-exposure step.

If the imageable layer is a masking layer in an element that comprises a photosensitive layer that is also sensitive to ultraviolet radiation, the amount of radiation used in the pre-exposure should be limited so that the photosensitive layer does not undergo a significant amount of photoinitiated reaction during the pre-exposure step. Typically, the imageable element should not be overall exposed for more than about one minute in a typical lightframe, such as an Olix A1 131 lighfframe. Imaging of the photosensitive layer of a flexographic printing plate precursor, for example, typically requires an exposure time of more than one minute in a typical lightframe. Preferably, the light frame is not evacuated during the pre-exposure step.

Imaging of the imageable layer may be carried out by well-known methods. The element may be imaged with a laser or an array of lasers emitting modulated near infrared or infrared radiation in a wavelength region that is absorbed by the absorber layer. Infrared radiation, especially infrared radiation in the range of about 800 nm to about 1200 nm, is typically used for imaging thermally imageable elements. Imaging is conveniently carried out with a laser emitting at about 830 nm, about 1056 nm, or about 1064 nm. Suitable commercially available imaging devices include image setters such as the Creo Trendsetter (CREO) and the Gerber Crescent 42T (Gerber). Imaging with 1064 nm radiation has been found to be particularly advantageous.

Alternatively, the thermally imageable element may be imaged using a hot body, typically with a conventional apparatus containing a thermal printing head. An imaging apparatus suitable for use in conjunction with thermally imageable composition comprises at least one thermal head but would usually include a thermal head array, such as a TDK Model No. LV5416 used in thermal fax machines and sublimation printers or the GS618-400 thermal plotter (Oyo Instruments, Houston, Tex., USA). The operating temperature of the thermal head is typically about 300° C. to 400° C. The typical heating time per pixel may be less than 1.0 ms. A contact pressure about 200 to 500 g/cm$^2$ between the thermal head and the imageable element typically is required for good heat transfer.

Imaging of the imageable layer produces imaged and unimaged regions. As described above, the vesicular image may be a positive mask or a negative mask. In some cases, it is advantageous to heat the imaged element to enhance the vesicular image. However, if thermal imaging is sufficient to decompose the sensitizer and to soften the polymeric material and allow the gas to expand, a separate thermal development step is not necessary. When thermal development is carried out, the imaged element is typically heated between about 100° C. and about 140° C. for about 10 seconds to about 30 seconds. Because heating softens the polymeric material and allows the gas to expand, post-imaging thermal development should not be carried out when the imageable layer has been pre-exposed with ultraviolet radiation prior to thermal imaging.

If a photosensitive layer is present, the imaged imageable layer is an integral mask. Following imaging of the imageable layer, the element is subjected to floodwise (overall or blanket) exposure through the integral mask with ultraviolet and/or visible radiation to which the photosensitive layer is sensitive, using light sources and procedures known in the art. For positive working imageable layers, the radiation used for overall exposure is effectively blocked by the unimaged regions of the imageable layer, but is at least partly transmitted by the imaged regions of the imageable layer. For negative working imageable layers, the radiation used for overall exposure is effectively blocked by the imaged regions of the imageable layer, but is at least partly transmitted by the unimaged regions of the imageable layer. Light sources include, for example, carbon arcs, mercury-vapor lamps, mercury xenon lamps, halide lamps, fluorescent lamps, and photographic flood lamps. The most suitable sources of ultraviolet radiation are the mercury-vapor lamps, particularly the sun lamps. A standard radiation source is the SYLVANIA® 350 Blacklight fluorescent lamp (FR 48T12/350 VL/VHO/180, 115 W), which has a central wavelength of emission around 354 nm.

Overall exposure forms a latent image in the photosensitive layer. For elements in which the photosensitive layer comprises a photopolymerizable layer, the latent image consists of polymerized regions and unpolymerized regions. If the imageable layer is negative working, the polymerized regions correspond to the unimaged regions of the imageable layer and the unpolymerized regions correspond the imaged regions of the imageable layer.

The exposure level depends on the thickness of the photosensitive layer, its sensitivity to the radiation used for overall exposure, and the amount of radiation transmitted by the imaged regions of the masking layer. However, the level of exposure is usually at least 0.1 $mJ/cm^2$.

For thick precursors such as are used to form flexographic printing plates, the process typically comprises a back exposure or backflash step. This is a blanket exposure through the substrate, using radiation to which the photosensitive layer is sensitive. Backflash exposure creates a shallow layer of photopolymerized material, or a floor, on the substrate side of the photosensitive layer. The floor improves adhesion between the photosensitive layer and the substrate and also establishes the depth of the relief image in the resulting flexographic printing plate.

Backflash exposure may be carried out before, after, or during the other imaging steps. Preferably, it is carried out after imaging of the imageable layer and just prior to overall exposure. Any of the conventional radiation sources discussed above can be used for the backflash exposure step. Exposure time generally range from a few seconds up to about a minute.

Following overall exposure through the mask, the element is developed with a suitable developer. Because the imageable layer is usually soluble in the developer, a separate pre-development step to remove the imageable layer, such as may be required when an ablatable imageable layer is used, is usually not required. Development is usually carried out at about room temperature. Development converts the latent image to an image by removing the unpolymerized regions of the photosensitive layer.

The developers can be organic solvents, aqueous or semi-aqueous solutions, and water. The choice of the developer will depend primarily on the chemical nature of the photosensitive layer. Suitable organic solvent developers include aromatic or aliphatic hydrocarbon and aliphatic or aromatic halohydrocarbon solvents, or mixtures of such solvents with suitable alcohols. Other organic solvent developers have been disclosed in Schober, U.S. Pat. No. 5,354,645. Suitable semi-aqueous developers usually contain water and a water miscible organic solvent and an alkaline material. Suitable aqueous developers usually contain water and an alkaline material. Other suitable aqueous developer combinations are described in Briney, U.S. Pat. No. 3,796,602.

Development time can vary, but it is preferably in the range of about 2 to 25 min. Developer can be applied in any convenient manner, including immersion, spraying and brush or roller application. Brushing aids can be used to remove the unpolymerized portions of the photosensitive layer. However, washout is frequently carried out in an automatic processing unit which uses developer and mechanical brushing action to remove the unexposed portions of the photosensitive layer, leaving a relief constituting the exposed image and the floor formed by the backside flask exposure.

Following development, the resulting flexographic printing plates are typically blotted or wiped dry, and then dried in a forced air or infrared oven. Drying times and temperatures may vary, however, typically the plate is dried for 60 to 120 min at 60° C. High temperatures are not recommended because the support can shrink and this can cause registration problems.

Flexographic printing plates are typically overall post-exposed to ensure that the photopolymerization process is complete and that the plate will remain stable during printing and storage. This post-exposure may be carried out with the same radiation source as overall exposure.

Detackification is an optional post-development treatment, which can be applied if the surface is still tacky, such tackiness not generally being removed in post-exposure. Tackiness can be eliminated by methods well known in the art, such as treatment with bromine or chlorine solutions. Such treatments have been disclosed in, for example, Greetzmacher, U.S. Pat. No. 4,400,459; Fickes, U.S. Pat. No. 4,400,460; and Hermann, U.S. Pat. No. 4,906,551. Detackification can also be accomplished by exposure to radiation sources having a wavelength not longer than 300 nm, as disclosed in Gibson U.S. Pat. No. 4,806,506.

INDUSTRIAL APPLICABILITY

The imageable element can be used in the preparation of flexographic printing plates. The element has an integral mask and, thus, the disadvantages of separate or laminated masks, such as dirt entrapment and reduced resolution, are avoided. No debris is produced in the imaging process, and when a heated body is used for imaging, expensive infrared absorber is not required.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution, and "total solids" refers to the total amount of nonvolatile material in the coating solution even though some of the additives may be nonvolatile liquids at ambient temperature. Except where indicated, the indicated percentages are percentages by weight based on the total solids in the coating solution.

| Glossary | |
|---|---|
| Aries Excel ™ | Positive printing plate precursor, size 460 × 660 × 0.3 mm (Kodak Polychrome Graphics, Norwalk, CT, USA). |
| Crescent Platesetter | Crescent/42T Platesetter, internal drum platesetter that operates at a wavelength of 1064 nm (Gerber Scientific, South Windsor, CT, USA). |
| Diazo 11/FB | (2,5-Diethoxy-4-(4'-tolylthio))-benzene diazonium fluoroborate (Charkit Chemical, Darien, CT, USA) |
| Diazo 347 | Diazo-N,N-diethylaniline fluoroborate (Aldrich, Milwaukee, WI, USA) |
| DR83 | Diazonium salt, condensation product of 4-diazo diphenylamine and 4,4'-bismethoxymethyl diphenyl ether, with a phosphate counter ion |
| DR93 | Diazonium salt, condensation product of 3-methoxy-4-diazo diphenylamine and 4,4'bismethoxymethyl diphenyl ether, with a mesitylene sulfonate counter ion |
| ELVANOL ® 71-30 | Medium viscosity, fully hydrolyzed poly(vinyl alcohol) (DuPont, Wilmington, Delaware, USA) |
| ELVANOL ® 85-82 | Poly(vinyl alcohol) (DuPont, Wilmington, Delaware, USA) |
| ELVANOL ® 90-50 | Fully hydrolyzed poly(vinyl alcohol) (DuPont, Wilmington, Delaware, USA) |
| Goldstar ™ Developer | Sodium metasilicate developer (Kodak Polychrome Graphics, Norwalk, CT, USA) |
| IR Dye A | Photothermal conversion material (see structure above) (Eastman Kodak, Rochester, NY, USA) |
| IR Dye B | Photothermal conversion material (see structure above) (Eastman Kodak, Rochester, NY, USA) |
| IR Dye D | Photothermal conversion material (see structure below) |
| IR Dye E | Photothermal conversion material (see structure below) |
| Olix Lightframe | Olix A1 131 lightframe with light integrator (OLEC, Irvine, CA, USA) |
| Oyo plotter | Oyo GS618-400 thermal plotter (Oyo Instruments, Houston, TX, USA) |
| PRINTEX ® FW2 | Carbon black (Degussa, Akron, OH, USA) |
| PRINTEX ® XE2 | Carbon black (Degussa, Akron, OH, USA) |
| RAVEN ® 1255 | Carbon black (Columbia Chemical, Marietta, GA, USA) |
| Saran F-278 | Terpolymer of vinylidene chloride, methacrylonitrile, and methyl methacrylate (Dow, Midland, MI, USA) |
| Saran F-310 | Vinylidene chloride/acrylonitrile copolymer (Dow, Midland, MI, USA) |
| SOLSPERSE ® 5000 | 100% active synergist agent (Avecia, Charlotte, NC, USA) |
| SOLSPERSE ® 20000 | Polymer dispersant agent (Avecia, Charlotte, NC, USA) |

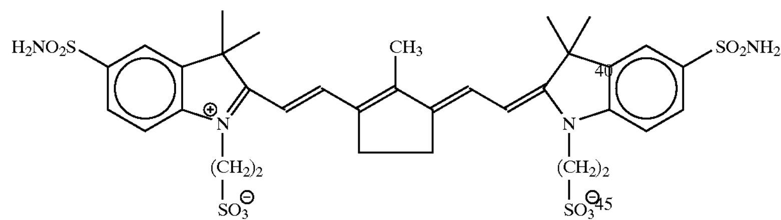

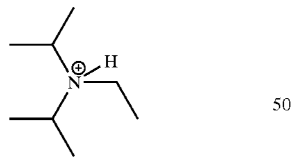

IR Dye D

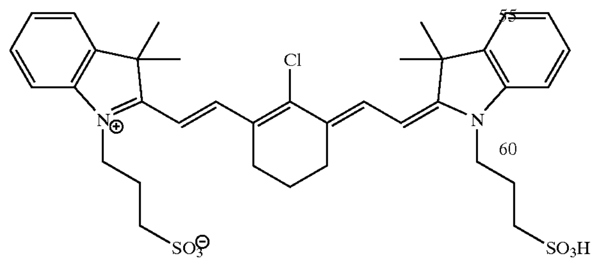

IR Dye E

Example 1

ELVANOL® 71-30 (42 g), DR93 diazonium salt (0.84 g), and IR Dye A (1.26 g) were added, in the order given, to a mixture of ethanol (42 g) and water (336 g). After the solids were thoroughly dissolved, the resulting coating solution was coated onto an unsubbed polyethylene terephthalate sheet using a wire wound Meyer bar. The resulting element was dried at 70° C. for 7 min in a Mathis Labdryer oven (Werner Mathis, Switzerland). Coating weight of the layer of thermally imageable vesicular imaging composition (imageable layer): 10 g/m$^2$.

The element was imagewise exposed with a Creo Trendsetter (Creo Products, Burnaby, BC, Canada) at 400 mJ/cm$^2$, using an internal test pattern. The Creo Trendsetter is a commercially available platesetter, which uses Procom Plus software and operates at a wavelength of 830 nm. The imaged element was heat developed in the Mathis Labdryer oven for 7 sec at 102° C. Where the laser had struck the layer of thermally imageable vesicular imaging composition, the layer became opaque and whitened while the unexposed regions remained transparent and blue/green. $D_{max}$ was 0.28, and $D_{min}$ was 0.06.

When an imaged element was heat developed at 138° C. for 7 sec, the $D_{max}$ was 0.28.

Example 2

The imaged and heat developed at 102° C. element formed in Example 1 was used as a mask for imaging an Aries Excel™ positive printing plate precursor. The precursor was exposed for 20 sec through the mask using an Olix lightframe and processed in a Mercury Mark V processor containing Goldstar™ developer at a processing speed 750 mm/min and a developer temperature 22.5° C. The regions of the photosensitive layer of the precursor that were under the transparent regions of the mask were removed by the developer, but the regions protected by the opaque, whitened regions of the mask, resisted development. Thus, an accurate copy of the mask image was transferred to the resulting printing plate.

Example 3

Example 1 was repeated except that zinc nitrate (2 g) was added to the coating solution immediately after addition of the DR93 diazonium salt. The imaged element was heat developed in the Mathis Labdryer oven for 7 sec at 102° C. Where the laser had struck the layer of thermally imageable vesicular imaging composition, the layer became opaque and whitened while the unexposed regions remained transparent and blue/green. Zinc nitrate is believed to be a vesicle enhancer and stabilizer.

Example 4

The procedure of Example 2 was repeated, except that the imaged element formed in Example 3 was used as a mask for imaging the Aries Excel™ positive printing plate precursor. The precursor was exposed for 60 sec through the mask. The regions of the photosensitive layer of the precursor that were under the transparent regions of the mask were removed by the developer, but the regions protected by the opaque, whitened regions of the mask, resisted development. Thus, an accurate copy of the mask image was transferred to the resulting printing plate.

Example 5

This example illustrates preparation and imaging of an imageable element that comprises a negative working photopolymerizable photosensitive layer.

The coversheet and release layer are removed from a CYREL® 67HLS flexographic printing plate precursor (DuPont, Wilmington, Del., USA). The resulting element comprises a photopolymerizable photosensitive layer on a substrate. The imageable layer of Example 3 is applied over the photopolymerizable photosensitive layer using a wire wound Meyer bar. The resulting element is heated at 70° C. for 7 min in the Mathis Labdryer oven. The coating weight of the layer of thermally imageable vesicular imaging composition is 8 g/m$^2$.

The resulting imageable element is imaged with a Creo Trendsetter at 400 mJ/cm$^2$ using an internal test pattern. The imaged element is heated in the Mathis Labdryer oven for 7 sec at 102° C. The imaged regions of the layer of thermally imageable vesicular imaging composition are opaque and whitened while the unexposed regions remain yellow and transparent.

The resulting element is then given a back flash exposure of 14 sec with a CYREL® 3040 light source (DuPont, Wilmington, Del., USA), and is then given a overall exposure of 2 min through the imaged imageable layer, without a vacuum. The exposed element is developed in a CYREL® rotary processor (DuPont, Wilmington, Del. USA) for 6 min using a 3:1 mixture (v/v) of tertachloroethylene (perclene) and butanol. The regions of the photosensitive layer under the exposed regions of the imageable layer are removed, to form a flexographic printing plate. The printing plate is oven dried for one hour at 60° C. and is then simultaneously post exposed and finished in a CYREL® light finishing unit (DuPont, Wilmington, Del., USA) for 5 min. On printing with the flexographic printing plate, good images are obtained.

Example 6

Example 1 was repeated, except the DR93 diazonium salt was replaced with DR83 diazonium salt (0.84 g). The imaged element was heat developed in the Mathis Labdryer oven for 7 sec at 102° C. Where the laser had struck the layer of thermally imageable vesicular imaging composition, the layer became opaque and whitened while the unexposed regions remained transparent and blue/green.

Example 7

An element consisting of an imageable layer on a substrate was prepared as described in Example 1. The substrate was 4 mil (about 100 micron) thick unsubbed polyethylene terephthalate sheet. The element was imaged with the Oyo GS618-400 plotter under the following conditions: 400×800 dpi (157×315 dpcm); 50% of the maximum internal power, and transport speed of 0.1 in/sec (about 0.25 cm/sec). The imageable layer became opaque and whitened in the imaged (heated) regions, while the unexposed (unheated) regions remained transparent and blue/green A second imageable element was imaged as described above and heat developed in the Mathis Labdryer oven for 7 sec at 102° C. The opaque and whitened regions appeared to increase in optical density.

An additional imageable element was imaged as described above, except that the element was inverted when placed in the thermal plotter so that the heated body was in direct contact with the substrate and the imageable layer was in contact with the rubber drum of the plotter. The imaged element was heat developed in the Mathis Labdryer oven for 7 sec at 102° C. The imageable layer became opaque and whitened in the exposed regions, but the imaged regions did not appear to be as strongly absorbing as the imaged regions formed when the heated body was in direct contact with the imageable layer.

Example 8

ELVANOL® 71-30 (42 g) was dissolved in a mixture of ethanol (42 g) and water (336 g). DR93 diazonium salt (0.84 g) was dissolved in the resulting solution. After the solids were thoroughly dissolved, the resulting coating solution was coated onto an unsubbed polyethylene terephthalate sheet using a wire wound Meyer bar. The resulting element was dried at 70° C. for 7 min in the Mathis Labdryer oven. Coating weight of the imageable layer: 10 g/m$^2$.

The resulting imageable element was imaged with the Oyo plotter as described in Example 7 with the heated body in direct contact with the imageable layer. The resulting imaged element was heat developed in the Mathis Labdryer oven for 7 sec at 102° C. The imageable layer became opaque and whitened in the imaged (heated) regions, while the unexposed (unheated) regions remained transparent and yellow.

The imaged element was used as a mask for the exposure of an Aries Excel™ positive plate precursor. The precursor was imaged and developed as described in Example 2. The regions of the photosensitive layer of the precursor that were under the transparent regions of the mask were removed by the developer, but the regions protected by the opaque, whitened regions of the mask, resisted development. Thus, an accurate copy of the mask image was transferred to the resulting printing plate.

Example 9

This example illustrates formation of a positive mask and its use with a positive working printing plate precursor.

A coating solution, prepared as in Example 1, was applied to an unsubbed polyethylene terephthalate substrate using a wire wound Meyer bar. The resulting element was dried at 70° C. for 7 min in the Mathis Labdryer oven. The coating weight of the imageable layer was 3 g/m$^2$.

The element was imaged as with the Creo Trendsetter at an exposure energy of 300 mJ/cm$^2$, using an internal test pattern. The resulting imaged element was heat developed in the Mathis Labdryer oven for 7 sec at 102° C. Poor vesicles, which transmitted the radiation used for overall exposure, were produced.

The imaged element was used as a mask for the exposure of an Aries Excel™ positive plate precursor. The precursor was imaged and developed as described in Example 2, except that the processing speed was 1500 mm/min. The regions of the photosensitive layer of the precursor that were under the imaged regions of the mask were removed by the developer, but the regions protected by unimaged regions of the mask, resisted development. Thus, an accurate copy of the mask image was transferred to the resulting printing plate.

Example 10

Saran F278 (5 g) was dissolved in tetrahydrofuran (30 g). Diazo 11/FB diazonium salt (0.3 g) was added to resulting solution followed by IR dye B (0.3 g). After the solids were thoroughly dissolved, the resulting coating solution was coated onto an unsubbed polyethylene terephthalate sheet using a wire wound Meyer bar. The resulting element was dried at 105° C. for 3 min in the Mathis Labdryer oven. Coating weight of the imageable layer 7 g/m$^2$.

The element was imaged as with the Creo Trendsetter at an exposure energy of 700 mJ/cm$^2$, using an internal test pattern. Where the laser struck the imageable layer, the layer became opaque and whitened while the unexposed regions remained transparent and green.

The resulting imaged element was heat developed in the Mathis Labdryer oven for 50 sec at 60° C. Because the laser exposure was sufficient to decompose the sensitizer and soften the polymer matrix, the vesicles were fully formed. Thermal development did not improve the vesicular appearance.

Example 11

Saran F310 (5 g) was dissolved in tetrahydrofuran (30 g). Diazo 347 diazonium salt (0.3 g) was added to this solution followed by IR dye B (0.3 g). After the solids had thoroughly dissolved, the resulting coating solution was applied to an unsubbed polyethylene terephthalate substrate using a wire wound Meyer bar. The resulting element was dried at 105° C. for 3 min in the Mathis oven. The coating weight of the imageable layer was 7 g/m$^2$.

The resulting imageable element was imaged with the Creo Trendsetter at 200 mJ/cm$^2$, using an internal test pattern. Where the laser struck the imageable layer, the layer became opaque and whitened while the unexposed regions remained transparent and green.

The resulting imaged imageable element was used as a mask in the exposure of an Aries Excel™ positive plate precursor. The precursor was exposed for 30 sec through the mask in the Olix lightframe. The exposed precursor was processed as described in Example 2. The regions of the photosensitive layer of the precursor that were under the transparent regions of the mask were removed by the developer, but the regions protected by the opaque, whitened regions of the mask, resisted development. Thus, an accurate copy of the mask image was transferred to the resulting printing plate.

An imaged and processed element, produced as described above, was used as a mask in the exposure of a Vistar 360 negative printing plate precursor (Kodak Polychrome Graphics). The precursor, size 460×660×0.3 mm, was exposed for 30 sec through the mask in the Olix lightframe. The exposed precursor was processed in a Javin PC32 processor (Kodak Polychrome Graphics) containing 955 developer (Kodak Polychrome Graphics), at a processing speed of 3 ft/min (about 91 cm/min). The regions of the photosensitive layer of the precursor that were under the transparent regions of the mask resisted development, but the regions protected by the opaque, whitened regions of the mask were removed by the developer. Thus, an accurate negative copy of the mask image was transferred to the resulting printing plate.

Example 12

The imageable element prepared in Example 10 was imaged with the Oyo plotter using the conditions described in Example 7. The imageable layer became opaque and whitened in the imaged (heated) regions, while the unexposed (unheated) regions remained transparent and green.

Example 13

Saran F278 (5 g) was dissolved in tetrahydrofuran (30 g). Diazo 11/FB diazonium salt (0.3 g) was added to this solution. After the solids had thoroughly dissolved, the resulting coating solution was applied to an unsubbed polyethylene terephthalate substrate using a wire wound Meyer bar. The resulting element was dried at 105° C. for 3 min in the Mathis oven. The coating weight of the imageable layer was 7 g/m$^2$.

The imageable element was imaged with the Oyo plotter using the conditions described in Example 7. The imageable layer became opaque and whitened in the imaged (heated) regions, while the unexposed (unheated) regions remained transparent and yellow.

Example 14

This example illustrates formation of a positive mask.

The coating solution from Example 11 was applied to an unsubbed polyethylene terephthalate substrate using a wire wound Meyer bar. The resulting element was dried at 105° C. for 3 min in the Mathis oven. The coating weight of the imageable layer was 3 g/m$^2$.

The resulting imageable element was imaged with the Creo Trendsetter at 100 mJ/cm$^2$ using an internal test pattern. Where the laser struck the imageable layer, the layer became opaque and whitened while the unexposed regions remained transparent and green.

The imaged element was used as a mask for the exposure of an Aries Excel™ positive plate precursor. The precursor was exposed for 15 sec through the mask in an Olix lighfframe. The resulting exposed element was then processed in a Mercury Mark V processor containing Goldstar™ developer (processing speed 1500 mm/min, developer temperature 22.5° C.). The regions of the imageable layer under the poorly defined, whitened vesicle regions of the mask, were removed by developer. The regions under the green regions of the mask resisted development. Thus, an accurate copy of the image was transferred to the resulting printing plate.

Examples 15–17

The coating solutions in Table 1 were prepared in tetrahydrofuran. Each coating solution was applied to an unsubbed polyethylene terephthalate substrate using a wire wound Meyer bar. The resulting elements were dried at 105° C. for 3 min in the Mathis oven. The coating weight of the imageable layer of each example was 8 g/m$^2$.

TABLE 1

| | Example | | |
|---|---|---|---|
| Component | 15 | 16 | 17 |
| | Parts by Weight[a] | | |
| Saran F-310 | 92.6 | 90.9 | 88.2 |
| Diazo 347 | 5.8 | 6.8 | 8.8 |
| IR dye A | 1.8 | 2.3 | 3.0 |

[a]In tetrahydrofuran

The imageable element of Example 15 was imaged with the Creo Trendsetter at 162, 325 and 676 mJ/cm$^2$, using an internal test pattern. An imaging energy of 325 mJ/cm$^2$ was the best imaging energy density investigated. Where the laser struck the imageable layer, the layer became opaque and whitened while the unexposed regions remained transparent and green. Excellent discrimination between the image and non-image regions was observed. The element imaged at 162 mJ/cm$^2$ was underexposed (the vesicular image had not fully formed). The element imaged at 676 mJ/cm$^2$ showed evidence of ablation (the imageable layer had been removed from the substrate).

Imageable elements from Examples 16 and 17 were exposed on the Creo Trendsetter at 8.5 W with drum speeds 55, 70, 85, 100, 115, 130, 145, 160 and 175 rpm, which produce imaging energy densities of 348, 274, 225, 192, 167, 147, 132, 120 and 109 mJ/cm$^2$, respectively. For Example 16, 274 mJ/cm$^2$ was found to be the best imaging energy density investigated. For Example 17, 147 mJ/cm$^2$ was found to be the best imaging energy density investigated. The elements from both Example 16 and Example 17 gave excellent discrimination between the image and non-image regions at these exposure energies.

The resulting imaged elements (the 325 mJ/cm$^2$ imaged element from Example 15, the 274 mJ/cm$^2$ imaged element from Example 16, and the 147 mJ/cm$^2$ from Example 17), were used as masks for exposure of Capricorn™ Gold positive printing plate precursors (Kodak Polychrome Graphics, Norwalk, Conn., USA). Each precursor, size 460×660×0.3 mm, was exposed for 45 sec through the mask using the Olix lighfframe. Each exposed precursor was processed as in Example 2. The regions of the photosensitive layer of the precursor that were under the transparent regions of the mask were removed by the developer, but the regions protected by the opaque, whitened regions of the mask, resisted development. Thus, an accurate copy of the mask image was transferred to each resulting printing plate.

An imaged element of Example 15 (the 325 mJ/cm$^2$ imaged element) was used as a mask for exposure of a Vistar 360 negative printing plate precursor. The precursor, size 460×660×0.3 mm, was exposed for 30 sec through the mask in the Olix lightframe. It was then processed as in Example 11. The regions of the photosensitive layer of the precursor that were under the transparent regions of the mask resisted development, but the regions protected by the opaque, whitened regions of the mask were removed by the developer. Thus, an accurate negative copy of the mask image was transferred to the resulting printing plate.

Additional imageable elements of Examples 15–17 were imaged with the Oyo plotter using the conditions of Example 7, except that the transport speed was 0.4 in/sec (about 1 cm/sec). The imageable layer became opaque and whitened in the imaged (heated) regions, while the unexposed (unheated) regions remained transparent and green.

Additional imageable elements of Examples 15–17 were imaged under the same conditions (Oyo plotter; transport speed of 0.4 in/sec), except that each element was inverted when placed in the thermal plotter so that the heated body was in direct contact with the substrate and the imageable layer was in contact with the rubber drum of the plotter. The imageable layer became opaque and whitened in the exposed regions, but the imaged regions did not appear to be as strongly absorbing as the imaged regions formed when the heated body was in direct contact with the layer of thermally imageable vesicular imaging composition.

Example 18

The ingredients in Table 2 were added to tetrahydrofuran. The resulting dispersion was coated onto an unsubbed polyethylene terephthalate sheet using a wire wound Meyer bar. The resulting element was dried at 105° C. for 3 min in the Mathis Labdryer oven. The coating weight of the layer of thermally imageable vesicular imaging composition was 7 g/m$^2$.

TABLE 2

| Component | Example 18 Parts by Weight[a] |
|---|---|
| Saran F-310 | 87.2 |
| Diazo 347 | 5.4 |
| Raven 1255 | 5.4 |
| SOLSPERSE ® 5000 | 0.5 |
| SOLSPERSE ® 20000 | 1.5 |

[a]In tetrahydrofuran

The resulting imageable element was imaged with the CreoTrendsetter at 450 mJ/cm$^2$ using an internal test pattern. Where the laser struck the imageable layer, the layer became opaque and whitened while the unexposed regions remained transparent and gray. Thus, discrimination between image and non-image regions was observed.

The resulting imaged element was used as a mask for exposure of a Capricorn™ Gold positive printing plate precursor (Kodak Polychrome Graphics, Norwalk, Conn., USA). The precursor, size 460×660×0.3 mm, was exposed for 40 sec through the mask using the Olix lightframe. The exposed precursor was processed as in Example 2, except that the processing speed was 1500 mm/min. The regions of the photosensitive layer of the precursor that were under the transparent regions of the mask were removed by the developer, but the regions protected by the opaque, whitened regions of the mask, resisted development. Thus, an accurate copy of the mask image was transferred to the resulting printing plate.

Example 19

This example illustrates preparation and imaging of an imageable element that comprises a negative working photopolymerizable photosensitive layer.

The coversheet and release layer are removed from a CYREL® 67HLS flexographic printing plate precursor. The resulting element comprises a photopolymerizable photosensitive layer on a substrate. The imageable layer of Example 18 is applied over the photopolymerizable photosensitive layer using a wire wound Meyer bar. The resulting element is heated at 105° C. for 3 min in the Mathis Labdryer oven. The coating weight of the layer of thermally imageable vesicular imaging composition was 7 g/m$^2$.

The resulting imageable element is imaged with a Barco CYREL® Digital Imager-Compact imagesetter using infrared radiation at 1064 nm from a YAG laser. The imaged regions of the imageable layer are opaque while the unexposed regions remain gray and transparent.

The resulting element is then given a back flash exposure of 14 sec with a CYREL® 3040 light source and is then given an overall exposure of 2 min through the imaged imageable layer, without a vacuum. The exposed element is developed in a CYREL® rotary processor for 6 min using a 3:1 mixture (v/v) of tertachloroethylene (perclene) and butanol. The regions of the photosensitive layer under the exposed regions of the imageable layer are removed, to form a flexographic printing plate. The resulting flexographic printing plate is oven dried for one hour at 60° C. and is then simultaneously post exposed and finished in a CYREL® light finishing unit for 5 min. An accurate, negative copy of the image formed on the imageable layer is transferred to the printing plate.

Alternatively, imaging of the imageable layer can be carried out with a Barco Cyrel Digital Imager—Classic imagesetter, or with a Barco Cyrel Digital Imager—Spark Imagesetter (Barco Graphics, Vandalia, Ohio., USA).

Examples 20 and 21

The ingredients in Table 3 were added to tetrahydrofuran. The resulting coating solutions were coated onto an unsubbed polyethylene terephthalate substrate using a wire wound bar. The dry coating weight of the layer of thermally imageable vesicular imaging composition was 7 g/m$^2$. The resulting imageable elements were dried at 105° C. for 3 min in the Mathis oven.

TABLE 3

| | Example | |
|---|---|---|
| | 20 | 21 |
| Component | Parts by Weight[a] | |
| Saran F-310 | 87.2 | 90.4 |
| Diazo 347 | 5.4 | 5.6 |
| Raven 1255 | 5.4 | 2.8 |
| SOLSPERSE ® 5000 | 0.5 | 0.3 |
| SOLSPERSE ® 20000 | 1.5 | 0.9 |

[a]In tetrahydrofuran

The resulting imageable elements were imaged on the Crescent platesetter at laser power 8.5 watts and mirror speed 255 revolutions per second, using an internal test pattern. Where the laser struck the imageable layer, the layer became opaque while the unexposed regions remained transparent and gray. Thus, discrimination between image and non-image regions was observed.

Examples 22 and 23

The procedure of Examples 21 and 22 was repeated except that the coating solutions shown in Table 4 were used.

TABLE 4

| | Example | |
|---|---|---|
| | 22 | 23 |
| Component | Parts by Weight[a] | |
| Saran F-310 | 91.6 | 92.4 |
| Diazo 347 | 5.7 | 5.8 |
| PRINTEX ® FW2 | 0.7 | — |
| PRINTEX ® XE2 | — | 0.6 |
| SOLSPERSE ® 5000 | 0.5 | 0.3 |
| SOLSPERSE ® 20000 | 1.5 | 0.9 |

[a]In tetrahydrofuran

Where the laser struck the imageable layer, the layer became opaque while the unexposed regions remained transparent and gray. Thus, discrimination between image and non-image regions was observed.

Additional imageable elements were imaged with the Creo Trendsetter at 470 mJ/cm$^2$, using an internal test pattern. Again, where the laser struck the imageable layer, the layer became opaque while the unexposed regions remained transparent and gray. Thus, discrimination between image and non-image regions was observed.

Examples 24–27

The ingredients in Table 5 were added to a mixture of water (88.9 wt %) and ethanol (11.1 wt %). The resulting coating solutions were coated onto an unsubbed polyethylene terephthalate substrate using a wire wound bar. The resulting imageable elements were dried at 700° C. for 7 min in the Mathis oven. The dry coating weight of the layer of thermally imageable vesicular imaging composition was 10 g/m$^2$.

TABLE 5

| | Example | | | |
|---|---|---|---|---|
| | 24 | 25 | 26 | 27 |
| Component | Parts by Weight[a] | | | |
| ELVANOL ® 71–30 | 95.2 | 93.4 | 90.0 | 95.2 |
| IR Dye A | 2.9 | 2.8 | 2.7 | 2.9 |
| DR 93 | 1.9 | 3.8 | 7.3 | |
| DR 83 | | | | 1.9 |

[a]In 88.9 wt % water and 11.1 wt % ethanol.

Each of the resulting imageable elements was overall (flood) exposed with ultraviolet radiation in the Olix lightframe for 60 seconds and imaged on the Creo Trendsetter at 450 mJ/cm$^2$ using an internal test pattern. Where the laser struck the imageable layer, the layer became opaque and whitened while the unexposed regions remained transparent blue/green.

Example 28

The imaged element formed in Example 24 was used as a mask for imaging an Aries Excel™ positive printing plate precursor. The precursor was exposed for 20 sec through the mask using the Olix lightframe and processed in a Mercury Mark V processor containing Goldstar™ at a processing speed 1500 mm/min and a developer temperature 22.50° C. The regions of the photosensitive layer of the precursor that were under the transparent regions of the mask were removed by the developer, but the regions protected by the opaque, whitened regions of the mask, resisted development.

Example 29

The imageable element formed in Example 24 was overall exposed with ultraviolet radiation as in Example 24 and imaged as described in Example 7. The imaged regions of the imageable layer became opaque and whitened in contrast to the unexposed regions, which remained transparent and blue/green.

Examples 30–32

The ingredients in Table 6 were added to a mixture of water (94.5 wt %) and ethanol (5.5 wt %). The resulting coating solutions were coated onto an unsubbed polyethylene terephthalate substrate using a wire wound bar. The resulting imageable elements were dried at 70° C. for 7 min in the Mathis oven. The dry coating weight of the layer of thermally imageable vesicular imaging composition was 10 g/m$^2$.

TABLE 6

| | Example | | |
|---|---|---|---|
| | 30 | 31 | 32 |
| Component[a] | Parts by Weight | | |
| ELVANOL ® 85–52 | 95.2 | — | — |
| ELVANOL ® 90–50 | — | 95.2 | — |
| ELVANOL ® 71–30 | — | — | 95.2 |
| IR Dye D | 2.9 | 2.9 | — |
| IR Dye E | — | — | 2.9 |
| DR 93 | 1.9 | 1.9 | 1.9 |

[a]In 94.5 wt % water and 5.5 wt % ethanol.

Each of the resulting imageable elements was overall (flood) exposed with ultraviolet radiation in the Olix lightframe for 60 seconds and imaged on the Creo Trendsetter at 376, 398, 451, 483 and 520 mJ/cm$^2$ using an internal test pattern. Where the laser struck the imageable layer, the layer became opaque and whitened while the unexposed regions remained transparent blue/green. For example 30, the best imaging energy density was 451 mJ/cm$^2$. For example 31, the best imaging energy density was 483 mJ/cm$^2$. For example 32, the best imaging energy density was 376 mJ/cm$^2$.

Having described the invention, we now claim the following and their equivalents.

What is claimed is:

1. A method for thermally forming vesicular images, the method comprising the steps of:

(A) providing an imageable element comprising an imageable layer over a substrate, in which the imageable layer comprises a thermally imageable vesicular imaging composition; and (B) thermally imaging the imageable layer and forming an imaged imageable layer, the imaged imageable layer comprising a vesicular image;

in which the thermally imageable vesicular imaging composition comprises a sensitizer, a polymeric material; and a photothermal conversion material.

2. The method of claim 1 in which the image is a positive image.

3. A method for thermally forming vesicular images, the method comprising the steps of:

(A) providing an imageable element comprising an imageable layer over a substrate, in which the imageable layer comprises a thermally imageable vesicular imaging composition; and (B) thermally imaging the imageable layer and forming an imaged imageable layer, the imaged imageable layer comprising a vesicular image;

in which the thermally imageable vesicular imaging composition comprises a sensitizer and polymeric material;

the image is a positive image and the method additionally comprises a thermal development step after step (B).

4. The method of claim 3 in which the thermally imageable vesicular imaging composition additionally comprises a photothermal conversion material.

5. The method of claim 1 in which the image is a negative image.

6. A method for thermally forming vesicular images, the method comprising the steps of:

(A) providing an imageable element comprising an imageable layer over a substrate, in which the imageable layer comprises a thermally imageable vesicular imaging composition; and (B) thermally imaging the imageable layer and forming an imaged imageable layer, the imaged imageable layer comprising a vesicular image;

in which the thermally imageable vesicular imaging composition comprises a sensitizer and polymeric material;

the image is a negative image and the method additionally comprises a thermal development step after step (B).

7. The method of claim 6 in which the thermally imageable vesicular imaging composition comprises a photothermal conversion material.

8. The method of claim 7 in which imaging is carried out with infrared radiation.

9. The method of claim 5 in which imaging is carried out with a hot body.

10. The method of claim 5 additionally comprising, before step (B), overall exposing the imageable layer with ultraviolet radiation.

11. A method for thermally forming vesicular images, the method comprising the steps of:

(A) providing an imageable element comprising an imageable layer over a substrate, in which the imageable layer comprises a thermally imageable vesicular imaging composition; and (B) thermally imaging the imageable layer and forming an imaged imageable layer, the imaged imageable layer comprising a vesicular image;

in which:

the thermally imageable vesicular imaging composition comprises a sensitizer, a polymeric material, and a photothermal conversion materials;

the image is a negative image; and before step (B), the imageable layer is overall exposed with ultraviolet radiation.

12. The method of claim 10 in which the sensitizer is a diazonium compound.

13. A method for forming a relief image, the method comprising the steps of:

(A) providing an imageable element, the imageable element comprising, in order:

(i) a substrate;

(ii) a photosensitive layer, the photosensitive layer comprising a photoimageable composition, and (III) a masking layer, the masking layer comprising a thermally imageable vesicular imaging composition, the thermally imageable vesicular imaging composition comprising a sensitizer and a polymeric material;

(B) thermally imaging the masking layer and forming a vesicular image in the masking layer;

(C) overall exposing the imageable element to actinic radiation through the masking layer and forming an imaged imageable element comprising imaged and complementary unimaged regions in the photosensitive layer; and (D) developing the imaged imageable element in a developer and forming the relief image by removing either the unimaged regions or the imaged regions.

14. The method of claim 13 in which the vesicular image is a negative image.

15. The method of claim 14 additionally comprising a thermal development step after step (B) and before step (C).

16. The method of claim 14 in which:

the substrate is a flexible substrate;

the photosensitive layer comprises a photopolymerizable composition; and developing the imaged imageable element in the developer removes the unimaged regions of the photosensitive layer.

17. The method of claim 16 in which the photosensitive layer is at least 0.25 cm thick.

18. The method of claim 17 additionally comprising a backflash exposure after step (A) and before step (D).

19. The method of claim 18 additionally comprising a thermal development step after step (B) and before step (C).

20. The method of claim 19 in which the sensitizer is a diazonium compound.

21. The method of claim 14 in which the thermally imageable vesicular imaging composition comprises a photothermal conversion material.

22. The method of claim 21 in which imaging is carried out with infrared radiation.

23. The method of claim 21 in which the sensitizer is a diazonium compound.

24. The method of claim 14 in which imaging is carried out with a hot body.

25. The method of claim 24 in which the sensitizer is a diazonium compound.

26. The method of claim 16 additionally comprising, before step (B), overall exposing the masking layer with ultraviolet radiation; in which the vesicular image is a negative image.

27. The method of claim 26 in which the sensitizer is a diazonium compound.

28. The method of claim 26 in which the thermally imageable vesicular imaging composition comprises a photothermal conversion material.

29. The method of claim 28 in which imaging is carried out with infrared radiation.

30. The method of claim 29 in which the sensitizer is a diazonium compound.

31. The method of claim 26 in which imaging is carried out with a hot body.

32. The method of claim 31 in which the sensitizer is a diazonium compound.

33. The method of claim 6 in which imaging is carried out with a hot body.

34. The method of claim 6 additionally comprising, before step (B), overall exposing the imageable layer with ultraviolet radiation.

* * * * *

UNITED STATES PATENT AND TRADEMARK OFFICE

CERTIFICATE OF CORRECTION

PATENT NO. : 6,794,107 B2
DATED : September 21, 2004
INVENTOR(S) : Ken-Ichi Shimazu, Kevin B. Ray and John Kalamen It is certified that error appears in the above-identified patent and that said Letters Patent is hereby corrected as shown below:

Column 27,
Line 33, delete "materials;" and insert -- material; --

Signed and Sealed this

Fifteenth Day of February, 2005

JON W. DUDAS
*Director of the United States Patent and Trademark Office*